(12) United States Patent
Makibuchi et al.

(10) Patent No.: US 8,552,622 B2
(45) Date of Patent: Oct. 8, 2013

(54) ACOUSTIC WAVE DEVICE

(75) Inventors: Daisuke Makibuchi, Shiga (JP);
Kazuhiro Otsuka, Shiga (JP)

(73) Assignee: Kyocera Corporation, Kyoto (JP)

( * ) Notice: Subject to any disclaimer, the term of this patent is extended or adjusted under 35 U.S.C. 154(b) by 344 days.

(21) Appl. No.: 13/001,610

(22) PCT Filed: Jun. 29, 2009

(86) PCT No.: PCT/JP2009/061876
§ 371 (c)(1),
(2), (4) Date: Jan. 18, 2011

(87) PCT Pub. No.: WO2009/157587
PCT Pub. Date: Dec. 30, 2009

(65) Prior Publication Data
US 2011/0115339 A1  May 19, 2011

(30) Foreign Application Priority Data
Jun. 27, 2008  (JP) .................... 2008-169563

(51) Int. Cl.
*H01L 41/047* (2006.01)
*H01L 41/053* (2006.01)

(52) U.S. Cl.
USPC ........................ 310/344; 310/348; 310/365

(58) Field of Classification Search
USPC ................. 310/340, 344, 348, 365
See application file for complete search history.

(56) References Cited

U.S. PATENT DOCUMENTS

| | | | |
|---|---|---|---|
| 5,850,677 A * | 12/1998 | Ryoichi | 29/25.35 |
| 6,674,221 B2 * | 1/2004 | Funahara et al. | 310/348 |
| 8,384,272 B2 * | 2/2013 | Fukano et al. | 310/344 |
| 2005/0029906 A1 * | 2/2005 | Miyaji | 310/348 |
| 2007/0252481 A1 * | 11/2007 | Iwamoto et al. | 310/344 |
| 2010/0308697 A1 * | 12/2010 | Aratake et al. | 310/348 |
| 2011/0234055 A1 * | 9/2011 | Fukano et al. | 310/365 |

FOREIGN PATENT DOCUMENTS

| | | |
|---|---|---|
| JP | 2002-261582 | 9/2002 |
| JP | 2003-037471 | 2/2003 |
| JP | 2007-324162 | 12/2007 |
| WO | WO 2008/018452 A1 | 2/2008 |

OTHER PUBLICATIONS

English translation of Japanese office action dated Jun. 19, 2012 issued in corresponding Japanese application 2010518093.

* cited by examiner

*Primary Examiner* — Thomas Dougherty
(74) *Attorney, Agent, or Firm* — DLA Piper LLP (US)

(57) ABSTRACT

An acoustic wave device according to one embodiment of the present invention has a base with a vibrating body, a sealing member which is joined to the base in a frame-shaped region surrounding the vibrating body and faces the vibrating body with a space therebetween, and an intermediate layer between the frame-shaped region of the sealing member and the base. The frame-shaped region has a recess and at least a portion of the intermediate layer is located inside the recess.

8 Claims, 16 Drawing Sheets

ACOUSTIC WAVE DEVICE

TECHNICAL FIELD

The present invention relates to an acoustic wave device.

BACKGROUND ART

In recent years, portable terminals used for mobile communication have been increasingly reduced in size and been made multi-banded to be able to handle a plurality of communication systems. Further, the portable terminals have been given more functions. Therefore, the built-in circuits have increased. For this reason, as the individual electronic parts used, for improvement of their mounting density, surface mountable small-size parts are being strongly demanded.

Among such electronic parts, there are the acoustic wave devices—used as the key parts of portable terminals. Acoustic wave devices include, for example, surface acoustic wave devices constituted by a piezoelectric substrate on which excitation electrodes are formed and thin film bulk acoustic resonators constituted by a thin piezoelectric film sandwiched between electrodes.

In the surface acoustic wave devices, to meet with the above demands for smaller size, the WLP (wafer level package) type has been proposed (for example, Patent Literature 1).

FIG. 15 is a cross-sectional view of principal parts schematically showing a surface acoustic wave device of the WLP type. As shown in FIG. 15, this surface acoustic wave device 101 is provided with a piezoelectric substrate 102 on one major surface of which excitation electrodes 103 are disposed and a sealing member 105 disposed on the piezoelectric substrate 102. More specifically, on the piezoelectric substrate 102, a protective film 104 covering the excitation electrodes 103 is disposed. The sealing member 105 is provided with a frame-shaped part 105a surrounding the excitation electrodes 103 and a lid part 105b disposed on the frame-shaped part 105a. Between the protective film 104 and the frame-shaped part 105a, an intermediate layer 106 joining these is disposed. By such a constitution, a space is formed between the excitation electrodes 103 covered by the protective film 104 and the lid part 105b. This space is tightly sealed by the sealing member 105. By performing this, invasion of moisture etc. in the atmosphere into the space inside this sealing member 105 is suppressed, and corrosion of the excitation electrodes 103 is suppressed.

In this regard, the surface acoustic wave device 101 is subjected to external force at the time of being diced from a wafer in a production process, at the time of washing in a mounting process, or at the time of use after mounting etc. Accordingly, peeling sometimes occurs between the sealing member 105a and an intermediate layer 106, so there was the problem of a decline in the airtight property of the space inside the sealing member 105.

The present invention was made in order to solve the above problem and has as an object thereof to provide an acoustic wave device able to suppress peeling of the sealing member and improve the airtight property of a space inside a sealing member.

CITATION LIST

Patent Literature

Patent Literature 1: Pamphlet of WO2008/018452

SUMMARY OF INVENTION

An acoustic wave device according to an embodiment of the present invention has a base with a vibrating body, a sealing member which is joined to the base in a frame-shaped region surrounding the vibrating body and faces the vibrating body with a space therebetween, and an intermediate layer between the frame-shaped region of the sealing member and the base. The frame-shaped region has a recess. At least a portion of the intermediate layer is located inside the recess.

According to the acoustic wave device explained above, peeling of the sealing member is suppressed, and the airtight property of the space inside the sealing member can be improved.

EMBODIMENTS OF INVENTION

Below, as embodiments of the acoustic wave device according to the present invention, a surface acoustic wave device is exemplified and explained with reference to the drawings.

Figure 1:
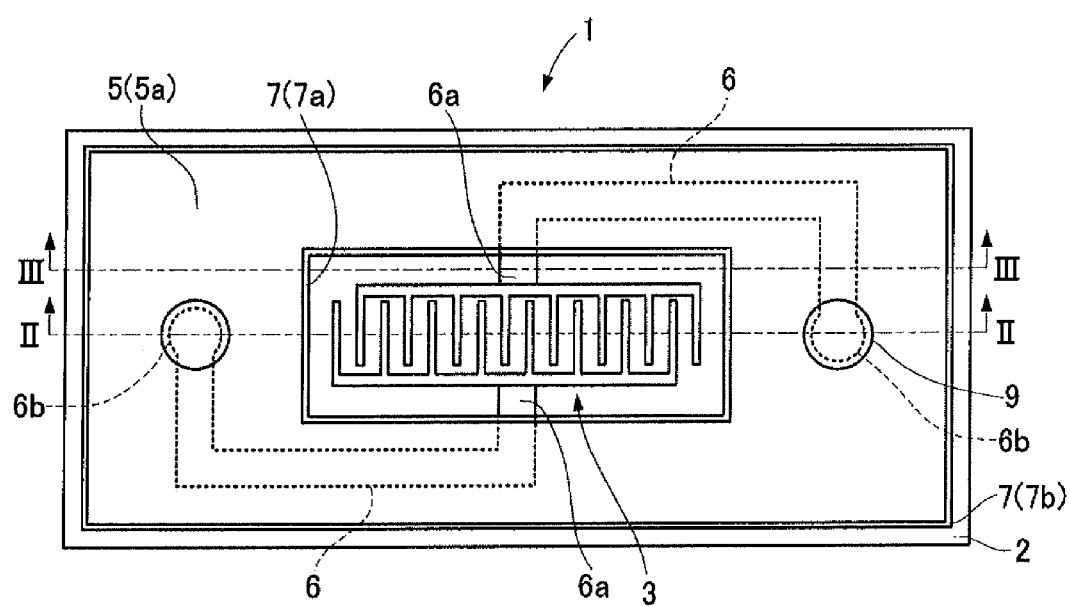
FIG. 1 A plan view of a surface acoustic wave device according to an embodiment of the present invention.
Figure 2:
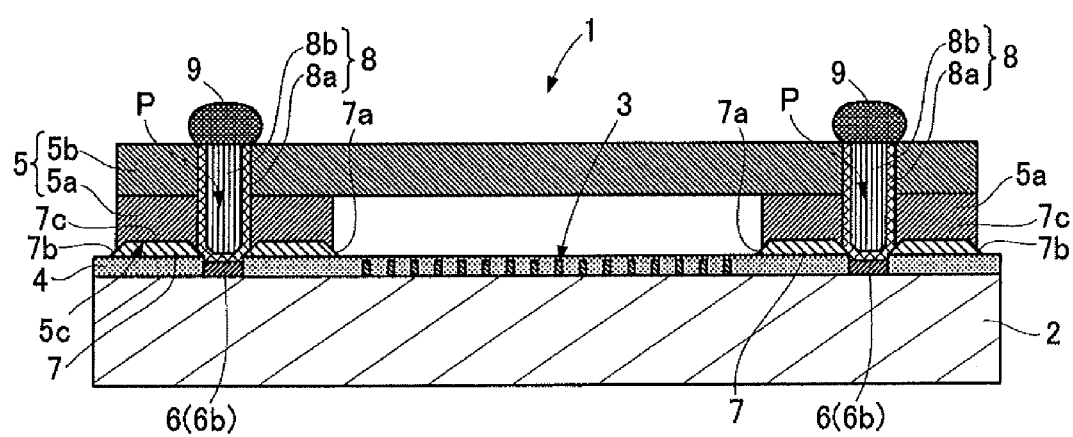
FIG. 2 cross-sectional view taken along II-II of the surface acoustic wave device of FIG. 1.
Figure 3:
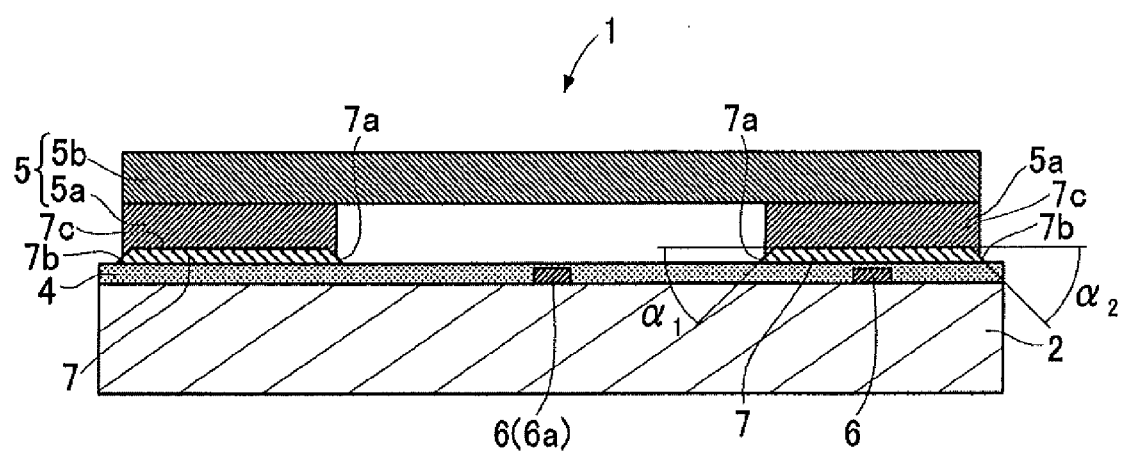
FIG. 3 A cross-sectional view taken along III-III of the surface acoustic wave device of FIG. 1.

As shown in FIG. 1 to FIG. 3, a surface acoustic wave device 1 according to the present embodiment is provided with a piezoelectric substrate 2, IDT (inter-digital transducer) electrodes 3 formed on a major surface of the piezoelectric substrate 2, connecting lines 6 connected to the IDT electrodes 3, and a sealing member 5 disposed on the piezoelectric substrate 2. Note that, in the present embodiment, the piezoelectric substrate 2 and IDT electrodes 3 correspond to the base and vibrating body in the present invention, and the IDT electrodes 3 are arranged on the piezoelectric substrate 2.

The piezoelectric substrate 2 is made of a piezoelectric material and can be formed by for example a single crystal of lithium tantalite (LiTaO$_3$), lithium niobate (LiNbO$_3$), crystal (SiO$_2$), lithium tetra-borate (Li$_2$B$_4$O$_7$), zinc oxide (ZnO), potassium niobate (KNbO$_3$), langasite (La$_3$Ga$_3$SiO$_{14}$), or the like.

The IDT electrodes 3 are interdigital electrodes formed by meshing at least a pair of comb-shaped electrodes with each other so that electrode fingers are alternately aligned. The IDT electrodes 3 function as excitation electrodes for exciting a surface acoustic wave on the piezoelectric substrate 2 in accordance with excitation signals impressed on a pair of comb-shaped electrodes.

The IDT electrodes 3 are formed by, for example, a conductive material such as an aluminum alloy represented by an aluminum-copper (Al—Cu) alloy, an aluminum element metal, or the like. Further, this IDT electrode 3 may be formed by stacking a plurality of layers made of different conductive materials.

Connecting lines 6 are extended on the piezoelectric substrate 2, connected at first ends to the IDT electrodes 3, and connected at the other ends to electrode posts 8 explained later. The connecting lines 6 are formed by an aluminum alloy represented by an aluminum-copper alloy, an aluminum element metal, or the like in the same way as the IDT electrodes 3. Further, the connecting lines 6 may be formed by stacking a plurality of layers made of different conductive materials as well in the same way as the IDT electrodes 3.

As shown in FIG. 2 and FIG. 3, on the major surface of the piezoelectric substrate 2, a protective film 4 covering the IDT electrodes 3 and connecting lines 6 is disposed. The protective film 4 is formed by, for example, an insulation material such as silicon oxide (SiO$_2$), silicon nitride (SiN), silicon (Si), or the like. By this protective film 4, corrosion due to oxidation of the IDT electrode 3 and connecting lines 6 and short-circuiting between electrode fingers of the IDT electrode 3 due to deposition of a conductive foreign substance are suppressed. Note that, end parts 6b opposite to end parts 6a connected with the IDT electrodes 3 in the connecting lines 6 are exposed from the protective film 4 and are connected with the electrode posts 8 as will be explained later. Note that, in FIG. 1, for convenience of explanation, the protective film 4 and the lid part 5b of the sealing member 5 explained later are not shown.

As shown in FIG. 1 to FIG. 3, the sealing member 5 is provided with a frame-shaped part 5a arranged to surround the IDT electrodes 5 and a lid part 5b disposed on the frame-shaped part 5a and is arranged with a space between this and the IDT electrodes 3. The frame-shaped part 5a and lid part 5b are formed by patterning a film-shaped forming member made of photo-resist by using photolithography or the like as will be explained later. As the photo-resist, an epoxy-based resin, polyimide resin, BCB (benzocyclobutene)-based resin, acrylic-based resin, or the like having photosensitivity can be used. Note that, in the present embodiment, the frame-shaped part 5a of the sealing member 5 corresponds to the frame-shaped region of the sealing member in the present invention.

As shown in FIG. 2 and FIG. 3, at the bottom surface of the frame-shaped part 5a (end parts on the protective film 4 side), recess 5c is formed. The recess 5c accommodates at least a portion of a later explained intermediate layer 7. Further, the recess 5c is formed in a ring shape so as to surround the IDT electrodes 3 in the same way as the frame-shaped part 5a.

Between the frame-shaped part 5a of the sealing member 5 and the protective film 4, an intermediate layer 7 joining these is formed. The intermediate layer 7 is formed by, as will be explained later, coating a photo-resist on the protective film 4 by spin coating or the like and patterning it by using photolithography or the like. By coating the photo-resist on the protective film 4 in this way, the photo-resist flows into minute uneven portion at the surface of the protective film 4, so contact between the intermediate layer 7 and the protective film 4 becomes high. As the photo-resist, an epoxy-based resin, polyimide resin, BCB-based resin, acrylic-based resin, or the like having photosensitivity can be used.

The top portion of the intermediate layer 7 is positioned inside the recess 5c of the frame-shaped part 5a and is accommodated in the recess 5c. More specifically, the intermediate layer 7 is provided with side surfaces inclined so that the width of the intermediate layer 7 is broadened from the side on the frame-shaped part 5a toward the protective film 4 side. In the present embodiment, the side surfaces of the intermediate layer 7 are provided with inner side surface 7a inclined so as to approach the IDT electrodes 3 from the frame-shaped part 5a side to the protective film 4 side and outer side surface 7b inclined so as to separate from the IDT electrodes 3 from the frame-shaped part 5a side to the protective film 4 side. The inclination angles $\alpha_1$ and $\alpha_2$ (see FIG. 3) of these inner side surface 7a and outer side surface 7b relative to the top surface 7c are set to for example 15 to 75 degrees and preferably set to 30 to 60 degrees from the viewpoint of later explained peel strength of the sealing member 5. Further, by the inner side surface 7a, outer side surface 7b, and top surface 7c of the intermediate layer 7 being joined with the frame-shaped part 5a, the top portion of the intermediate layer 7 is accommodated in the recess 5c of the frame-shaped part 5a. By performing this, a space formed on the protective film 4 covering the IDT electrodes 3 is tightly sealed by the sealing member 5.

On end parts 6b in the connecting lines 6 opposite to end parts 6a connected to the IDT electrodes 3, first end portions of columnar electrode posts 8 are connected. These electrode posts 8 are extended up to the top surface of the lid part 5b through penetration holes P formed in the intermediate layer 7 and the frame-shaped part 5a and lid part 5b of the sealing member 5. Note that, each electrode post 8 has a plating use base layer 8a formed along the inner surface of this penetration hole P and a columnar part 8b formed inside the plating use base layer 8a. The plating use base layer 8a is formed by, for example, Ti (titanium) so as to improve the contact with the connecting lines 6. Further, the columnar part 8b is formed by for example causing Cu (copper) to deposit on the plating use base layer 8a by the later explained electroplating.

External connection terminals 9 are disposed on the upper end surfaces of the electrode posts 8. The external connection terminals 9 can be formed by for example solder bumps made of a Pb—Sn alloy or the like. By connecting these external connection terminals 9 to a not shown external drive circuit, excitation signals are given through the electrode posts 8 and connecting lines 6 to the IDT electrodes 3.

The surface acoustic wave device 1 constituted as described above is used by, for example, flip chip connecting the external connection terminals 9 to connection terminals in a wireless circuit etc. mounted in a mobile communication device.

Next, an explanation is given on an embodiment of a method of production of a surface acoustic wave device according to the present embodiment with reference to the drawings.

Figure 4A:
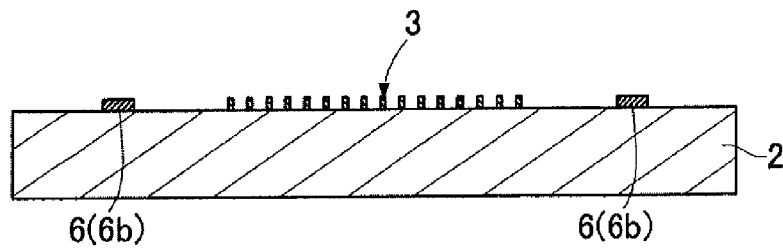
FIG. 4 Views showing manufacture steps at the II-II cross-section of the surface acoustic wave device of FIG. 1.

First, as shown in FIG. 4A, on the top surface of the piezoelectric substrate 2, IDT electrodes 3 and connecting lines 6 are formed. Specifically, a thin film formed by thin film forming method such as sputtering, vapor deposition, CVD (chemical vapor deposition), PVD (physical vapor deposition), or the like is patterned to desired shapes by photolithography or the like using a reduced projection exposure apparatus (stepper) and RIE (reactive ion etching) apparatus. Note that, in the present embodiment, the connecting lines 6 are formed simultaneously with the formation of the IDT electrodes 3, therefore the IDT electrodes 3 and connecting lines 6 are formed by the same material.

Figure 4B:
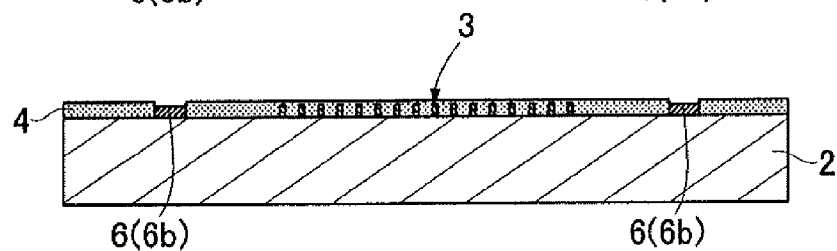

Next, as shown in FIG. 4B, on the piezoelectric substrate 2, a protective film 4 is formed covering the IDT electrodes 3 and connecting lines 6. The protective film 4 is formed by thin film forming method such as CVD, sputtering, or the like. Note that, the end parts 6b in the connecting lines 6 on the side connected to the electrode posts 8 are exposed by removing parts of the formed protective film 4 using photolithography or the like.

Figure 4C:
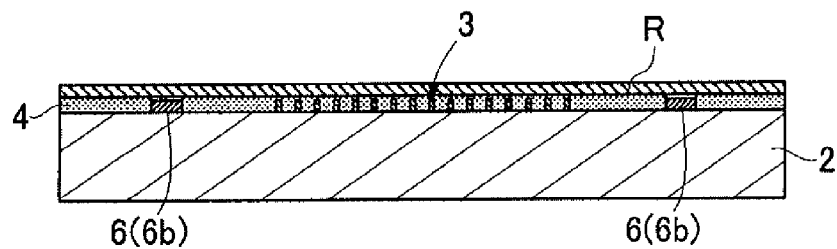

Next, as shown in FIG. 4C, a photo-resist is coated on the protective film 4 by spin coating or the like to form a resin film R. Then, as shown in FIG. 4B, this resin film R is patterned by photolithography, then caused to cure to thereby form the intermediate layer 7. At this time, holes 7p for arranging the electrode posts 8 which will be formed later are simultaneously formed.

Figure 4D:
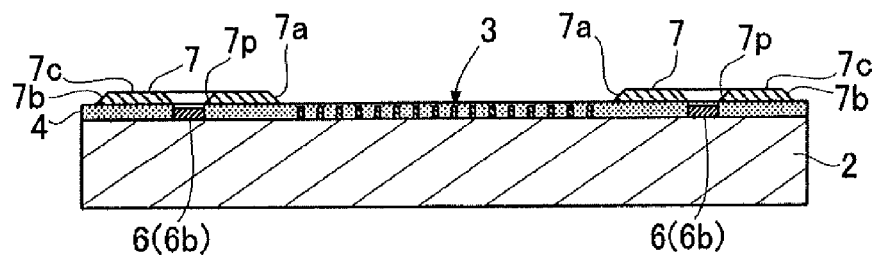

Here, to make the inclined inner side surface 7a and outer side surface 7b of the intermediate layer 7, for example, it is sufficient to intentionally shift the focus of the image-forming plane in an exposure process of the resin film R when using photolithography so that the width of the parts of the resin film R exposed (parts to be removed in the process of FIG. 4D) become narrower at the piezoelectric substrate 2 side. Note that, in the present embodiment, the inner circumferential surfaces of the holes 7p are formed to be inclined as well in the same way as the side surfaces of the intermediate layer 7.

Figure 4E:
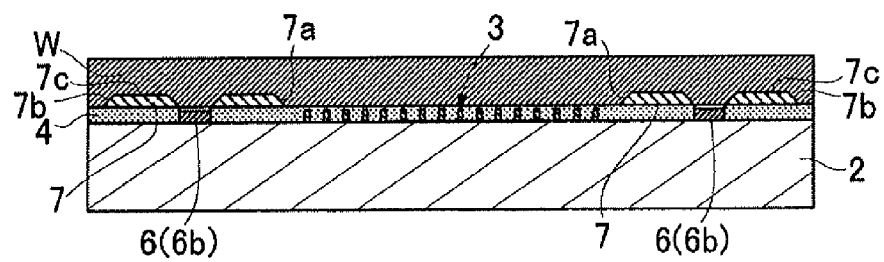
Figure 16:
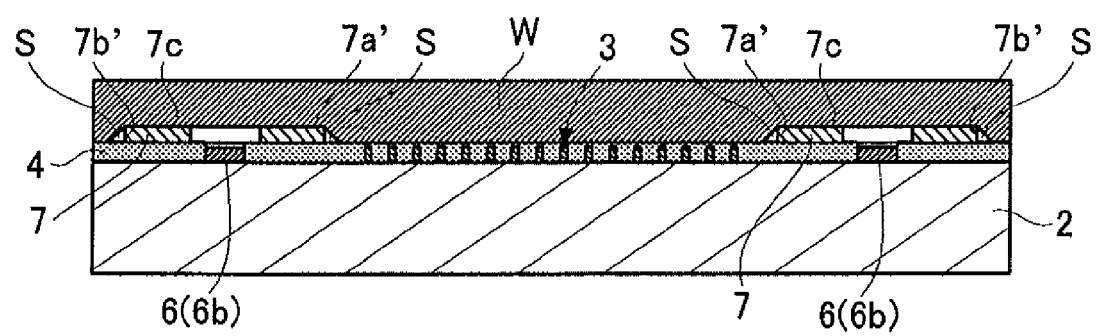
FIG. 16 A cross-sectional view showing a comparative example for the manufacturing steps of the surface acoustic wave device of FIG. 4E.

Next, as shown in FIG. 4E, a first film W made of a photo-resist is stacked to cover the protective film 4 on the intermediate layer 7 and IDT electrodes 3. This first film W is stacked by using a bonding machine able to press and bond a film by a roller while managing the temperature, suitably setting the temperature and pressure, and bonding the film onto the intermediate layer 7 and protective film 4. At this time, as shown in FIG. 4E, preferably the intermediate layer 7 is provided with inclined side surfaces (inner side surface 7a and outer side surface 7b). That is, as shown in FIG. 16, if the side surfaces 7a' and 7b' of the intermediate layer 7 are not inclined, but vertical relative to the top surface of the protective film 4, when the first film W is bonded while pressing it by a roller, it is hard to make this contact the side surfaces of the intermediate layer 7. Accordingly, as shown in FIG. 16, spaces S would be formed between the side surfaces of the intermediate layer 7 and the first film W. Contrary to this, when side surfaces of the intermediate layer 7 are inclined as in the present embodiment, as shown in FIG. 4E, spaces are hard to formed between side surfaces 7a and 7b of the intermediate layer 7 and the first film W, and the contact between these can be improved. Note that, in the present embodiment, the inner circumferential surfaces of the holes 7p of the intermediate layer 7 are inclined as well, therefore it becomes easier to make the inner circumferential surfaces and the first film W contact.

Figure 4F:
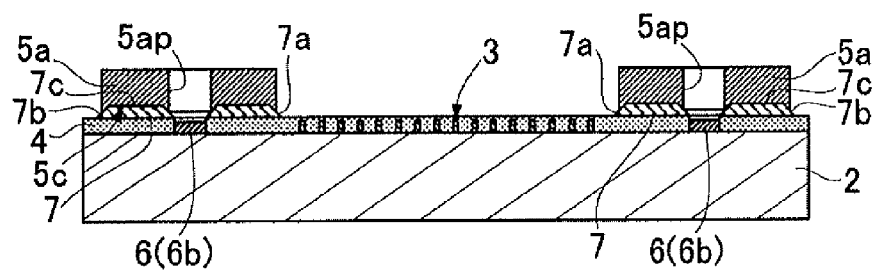

Next, as shown in FIG. 4F, the first film W is patterned by using photolithography, then cured to thereby form the frame-shaped part 5a. At this time, holes Sap for arranging the electrode posts 8 which will be formed later are simultaneously formed. Further, the frame-shaped part 5a and the intermediate layer 7 are joined by heating.

Note that, the frame-shaped part 5a is preferably made of a material having a larger thermal expansion coefficient than that of the intermediate layer 7. The frame-shaped part 5a formed at a high temperature is reduced in volume more than the intermediate layer 7 when its temperature falls to room temperature. Accordingly, in the case the frame-shaped part 5a is joined with the inner side surface 7a, outer side surface 7b, and top surface 7c of the intermediate layer 7, the contact between the frame-shaped part 5a and the intermediate layer 7 is improved by the force of the frame-shaped part 5a as it tries to shrink.

Note that, in the present embodiment, the frame-shaped part 5a is formed by using the first film W. However, the frame-shaped part 5a may be formed by, for example, coating a liquid photo-resist on the intermediate layer 7 and protective film 4 by spin coating or the like in place of the first film W, curing this, and then patterning it by using photolithography.

Figure 5G:
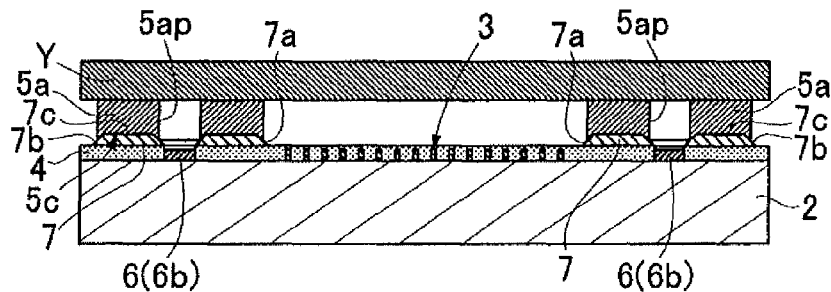
FIG. 5 Views showing manufacture steps at the II-II cross-section of the surface acoustic wave device of FIG. 1.

Next, as shown in FIG. 5G, a second film Y made of a photo-resist is stacked on the frame-shaped part 5a. This second film Y is stacked by using a bonding machine, suitably setting the temperature and pressure, and bonding this onto the frame-shaped part 5a in the same way as the first film W.

Figure 5H:
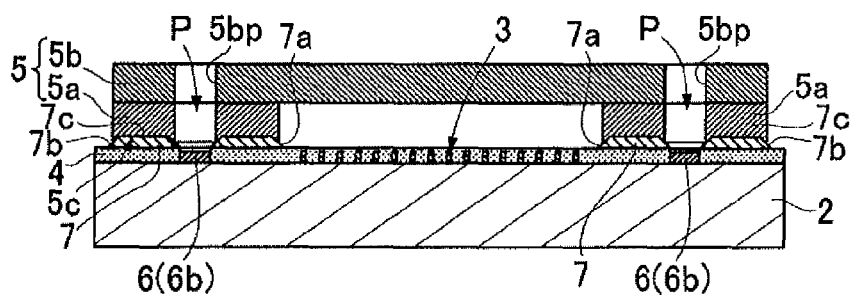

Next, as shown in FIG. 5H, the second film Y is patterned by using photolithography, then cured to thereby form the lid part 5b. At this time, holes 5bp for arranging the electrode posts 8 which will be formed later are simultaneously formed. Penetration holes P of the sealing member 5 are formed by holes 7p of the intermediate layer 7, holes Sap of the frame-shaped part 5a, and holes 5bp of the lid part 5b. Further, the lid part 5b and the frame-shaped part 5a are joined by heating. Note that, when an epoxy resin is used as the material of the frame-shaped part 5a and the lid part 5b, the two may be heated to about 100° C. By performing this, the two can be integrally joined, and the contact and airtight property can be improved.

Figure 5I:
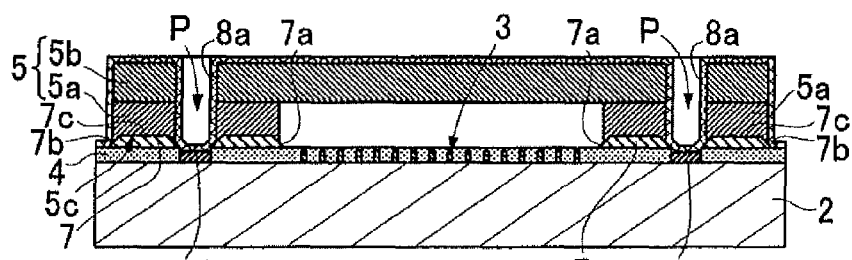

Next, as shown in FIG. 5I, a plating use base layer 8a is formed on the inner surfaces of penetration holes P of the sealing member 5 and the end parts 6b of the connecting lines 6. The plating use base layer 8a is for forming the columnar parts 8b of the electrode posts 8 to be formed later by deposition by electroplating. As the plating use base layer 8a, for example, by using sputtering, a Ti (titanium) film can be formed.

Figure 5J:
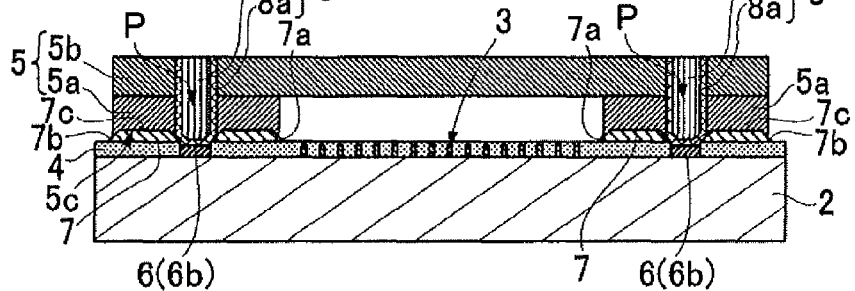

Next, as shown in FIG. 5J, columnar parts 8b of the electrode posts 8 are formed. These electrode posts 8 are formed by, for example in the state of FIG. 5I, forming a not shown plating use resist on region of the plating use base layer 8a other than the portions formed in the penetration holes P and depositing copper on the plating use base layer 8a formed in the penetration holes P by electroplating. After forming the electrode posts 8, the plating use resist and the region of the plating use base layer 8a other than the portions formed in the penetration holes P are removed.

Note that, although not shown, the top end surfaces of the electrode posts 8 may also be flattened by chemical mechanical polishing, then a Ni (nickel) layer and Au (gold) layer sequentially formed on the top end surfaces of these electrode posts 8 by using electroless plating. By performing this, the wettability in a case where the external connection terminals 9 to be formed later are formed by solder and the connection between the external connection terminals 9 and the electrode posts 8 can be improved.

Figure 5K:
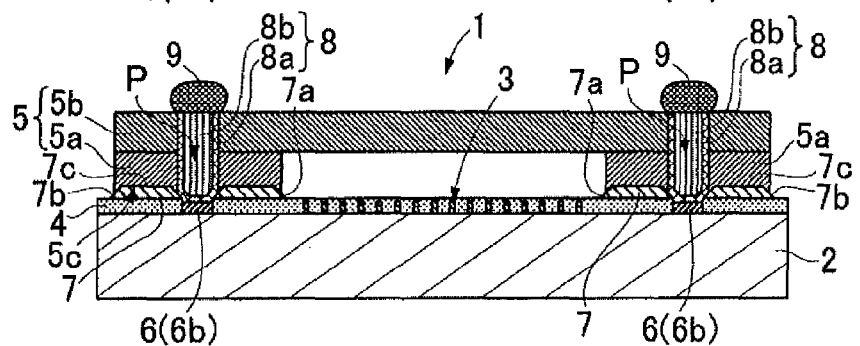

Next, as shown in FIG. 5K, external connection terminals 9 are formed on the upper end surfaces of the electrode posts 8. These external connection terminals 9 can be formed by, for example, screen printing a cream solder on upper end surfaces of the electrode posts 9 and then making it reflow.

The surface acoustic wave device 1 according to the present embodiment is produced as described above. Note that, for convenience of explanation, the above manufacturing steps were explained in a state where the piezoelectric substrate 2 was cut into a rectangular state. In actuality, however, one wafer-shaped piezoelectric substrate can be used to form a plurality of surface acoustic wave devices 1 in a state sharing this one piezoelectric substrate, then the piezoelectric substrate can be cut into rectangles to separate the individual surface acoustic wave devices 1.

According to the surface acoustic wave device 1 according to the present embodiment, as shown in FIG. 2 and FIG. 3, recess 5c formed in the lower end portion of the frame-shaped part 5a accommodates a part of the intermediate layer 7. Therefore, the lower end portion of the frame-shaped part 5a is joined with the inner side surface 7a and outer side surface 7b of the intermediate layer 7. Thus, for example, the peel strength between the frame-shaped part 5a and intermediate layer 7 with respect to external force applied in a left-right direction in FIG. 2 and FIG. 3 can be improved. That is, parts at the lower end portion of the frame-shaped part 5a joined with the inner side surface 7a and outer side surface 7b of the intermediate layer 7 act so as to counter external force in the left-right direction, therefore peeling between the frame-shaped part 5a and the intermediate layer 7 can be suppressed. Accordingly, the airtight property of the space inside the sealing member 5 can be improved.

Further, in this way, the lower end portion of the frame-shaped part 5a is joined with the inner side surface 7a and outer side surface 7b of the intermediate layer 7. Therefore, compared with a case where these are joined with only the top surface 7c of the intermediate layer 7, the contact area between the frame-shaped part 5a and the intermediate layer 7 becomes larger. Thus the contact between the frame-shaped part 5a and the intermediate layer 7 is improved. According to this as well, peeling between the frame-shaped part 5a and the intermediate layer 7 can be suppressed.

Note that, in the above description, an explanation was given only of peeling with respect to external force in the right-left direction of FIG. 2 and FIG. 3. However, for example, with respect to external force in an up-down direction of FIG. 1 (a direction perpendicular to the II-II cross-section), in the same way, peeling between the frame-shaped part 5a and the intermediate layer 7 can be suppressed.

Figure 6:
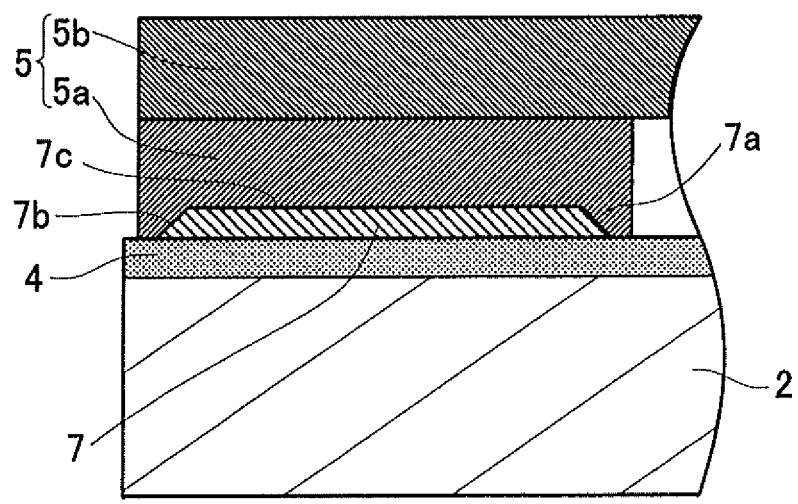
FIG. 6 A cross-sectional view of principal parts showing a modification of the surface acoustic wave device shown in FIG. 3.

Above, one embodiment of the acoustic wave device of the present invention was explained. However, the present invention is not limited to the above embodiment. Various modifications are possible within a range not out of the gist thereof. For example, in the above embodiment, as shown in FIG. 2 and FIG. 3, the recess 5c of the sealing member 5 accommodates the only upper portion of the intermediate layer 7. However, the recess 5c is not limited to this so far as the recess 5c accommodates at least a portion of the intermediate layer 7. For example, as shown in FIG. 6, the recess 5c of the sealing member 5 may be constituted to accommodate the entire intermediate layer 7. In this case, the lower end portion of the frame-shaped part 5a of the sealing member 5 is joined with the entire inner side surface 7a and outer side surface 7b of the intermediate layer 7.

Figure 7:
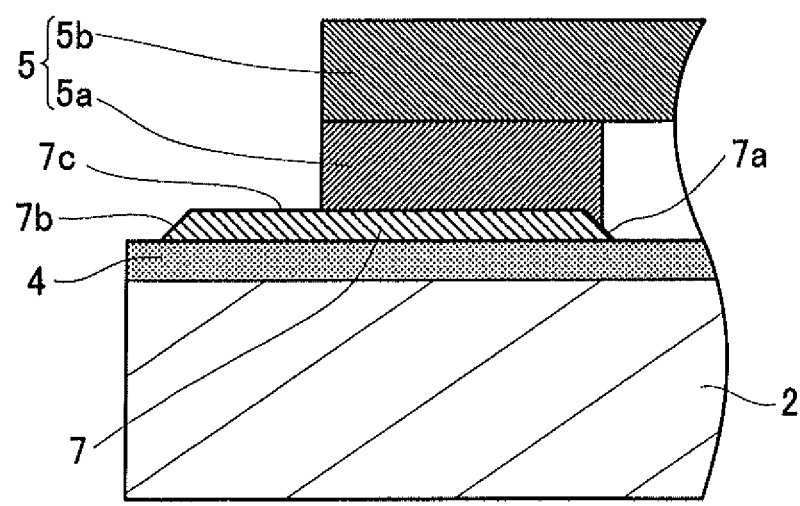
FIG. 7 A cross-sectional view of principal parts showing a modification of the surface acoustic wave device shown in FIG. 3.

Alternatively, as shown in FIG. 7, the recess 5c of the frame-shaped part 5a may be formed so that the frame-shaped part 5a of the sealing member 5 is joined with only the top surface 7c and inner side surface 7a of the intermediate layer 7. Further, although not shown, the recess 5c of the frame-shaped part 5a may be formed so that the frame-shaped part 5a of the sealing member 5 joined with only the top surface 7c and outer side surface 7b of the intermediate layer 7.

Figure 8:
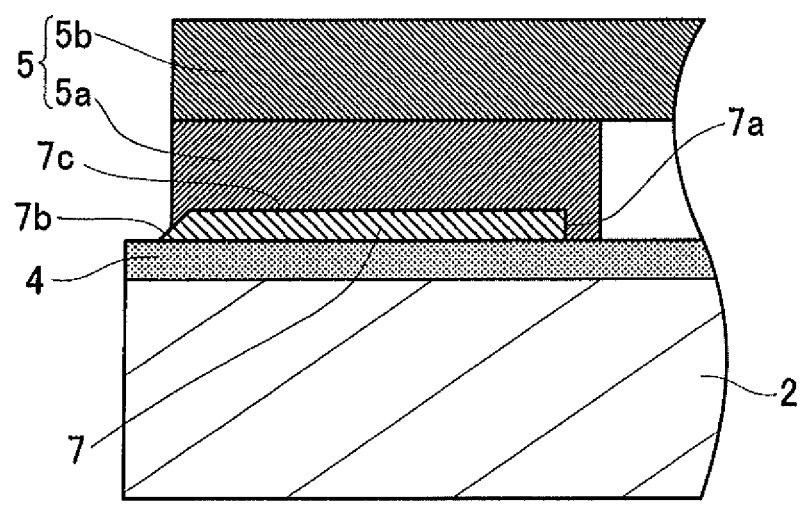
FIG. 8 A cross-sectional view of principal parts showing a modification of the surface acoustic wave device shown in FIG. 3.
Figure 9:
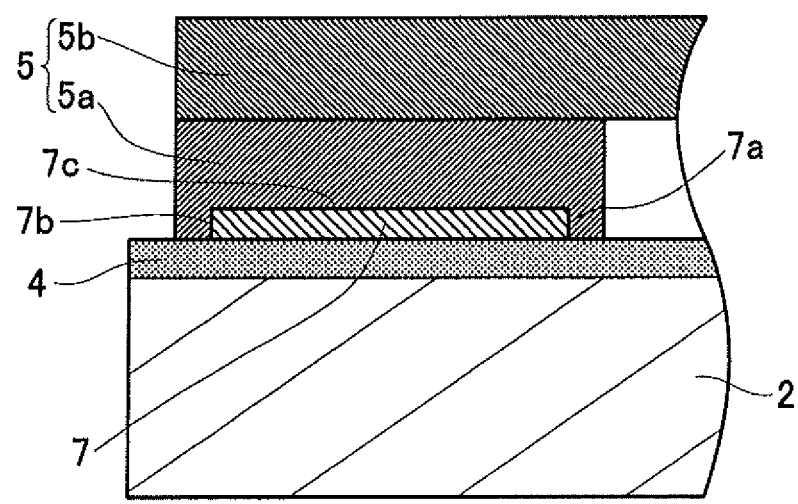
FIG. 9 A cross-sectional view of principal parts showing a modification of the surface acoustic wave device shown in FIG. 3.

Further, the intermediate layer 7 in the above embodiment has inclined inner side surface 7a and outer side surface 7b, but the intermediate layer 7 is not limited to this. For example, as shown in FIG. 8, the side surfaces of the intermediate layer 7 may be formed so that only the outer side surface 7b of the intermediate layer 7 is inclined. Further, although not shown, they may be formed so that only the inner side surface 7a of the intermediate layer 7 is inclined. Alternatively, as shown in FIG. 9, they may be formed so that both of inner side surface 7a and outer side surface 7b of the intermediate layer 7 are not inclined, but become vertical relative to the top surface 7c.

Further, in the above embodiment, the shapes of the inner side surface 7a and outer side surface 7b of the intermediate layers 7 became flat shapes, but the shapes are not limited to this. For example, the inner side surface 7a and the outer side surface 7b may respectively have pluralities of flat planes having inclination angles different from each other or may have curved shapes.

Further, in the above embodiment, as shown in FIG. 1, the intermediate layer 7 is formed so as to continuously surround the IDT electrodes 3. However, for example, the intermediate layer 7 may be formed so as to intermittently surround the IDT electrodes 3. In this case as well, the intermediate layer 7 is accommodated by the recesses 5c of the sealing member 5, therefore peeling between the sealing member 5 and the intermediate layer 7 can be suppressed.

Further, in the above embodiment, the protective film 4 and the intermediate layer 7 are constituted as different members. However, for example, the intermediate layer 7 may be integrally formed as a portion of the protective film 4 so that the protective film 4 has the intermediate layer 7. That is, the intermediate layer 7 may be formed by a portion extended between the frame-shaped part 5a of the sealing member 5 and the base 2. Alternatively, the protective film 4 may not be formed between the intermediate layer 7 and the piezoelectric substrate 2, but the intermediate layer 7 may be directly formed on the piezoelectric substrate 2.

Further, in the above embodiment, the base in the present invention is constituted by the piezoelectric substrate 2, but the base is not limited to this. The base may be constituted by forming a thin piezoelectric film on an insulating substrate.

Figure 10:
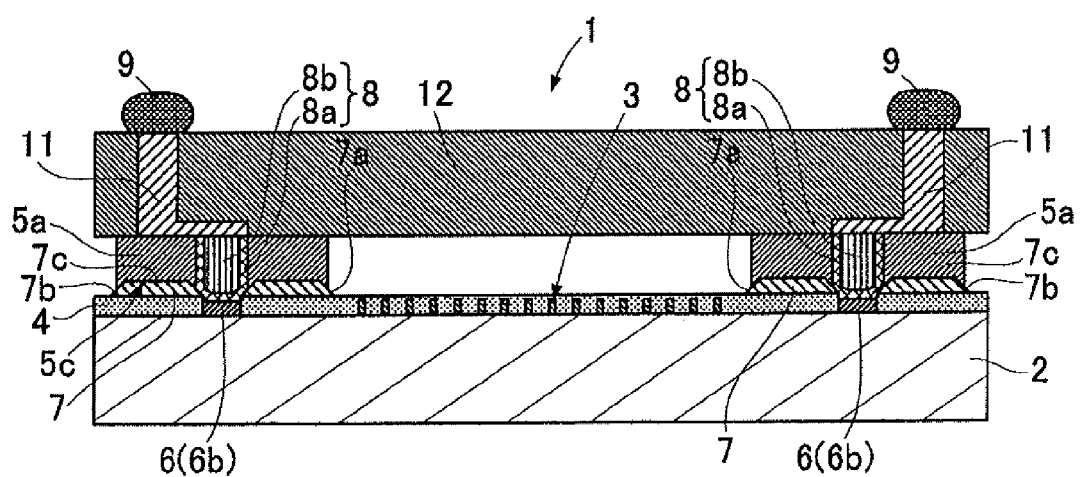
FIG. 10 A cross-sectional view of principal parts of the surface acoustic wave device according to an embodiment of the present invention.

Further, in the above embodiment, the lid part 5b is formed by a film. However, for example, as shown in FIG. 10, it may be formed by an wiring substrate 12 having conductive wirings 11 inside it. In this case, the electrode posts 8 are connected through the conductive wirings 11 to the external connection terminals 9.

Figure 11:
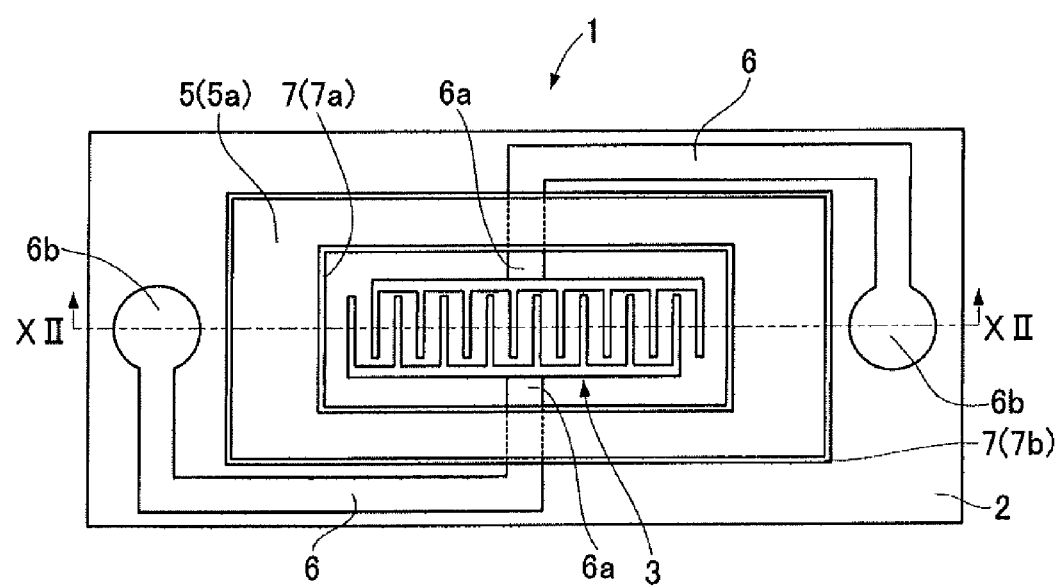
FIG. 11 A plan view of the surface acoustic wave device according to an embodiment of the present invention.
Figure 12:
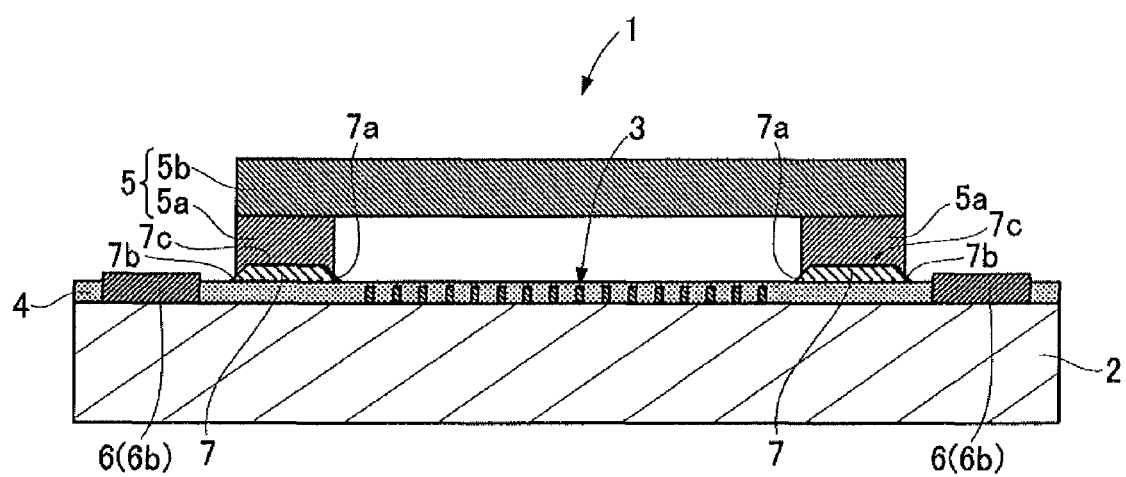
FIG. 12 A cross-sectional view taken along XII-XII of the surface acoustic wave device of FIG. 11.

Further, as shown in FIG. 11 and FIG. 12, the connecting lines 6 in the above embodiment can be drawn to the outside of the sealing member 5, and the end parts 6b of the connecting lines 6 can be constituted as electrode pads. In this case, by wire bonding to the end parts 6b of the connecting lines 6, the surface acoustic wave device 1 of FIG. 11 and FIG. 12 can be mounted face up. Note that, in the surface acoustic wave device 1 shown in FIG. 11 and FIG. 12, components the same or similar to those of the surface acoustic wave device shown in FIG. 1 and FIG. 3 are assigned the same notations and detailed explanations are omitted. Further, in FIG. 11, for convenience of explanation, the protective film 4 and the lid part 5b of the sealing member 5 are not shown.

Figure 13:
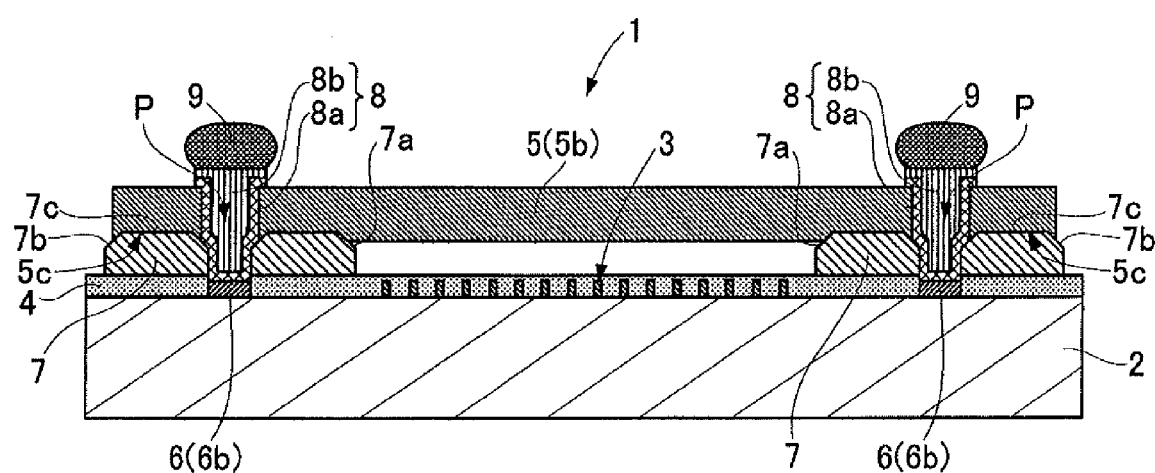
FIG. 13 A cross-sectional view of principal parts of the surface acoustic wave device according to an embodiment of the present invention.

Further, in the above embodiment, the frame-shaped region of the sealing member in the present invention is comprised of the frame-shaped part 5a shown in FIG. 2, but the frame-shaped region is not limited to this. For example, the frame-shaped part 5a may not be provided, the frame-shaped region of the sealing member in the present invention may be defined as a circumferential edge region of the lid part 5b of the sealing member 5 as shown in FIG. 13, and the recess 5c may be formed in this circumferential edge region so as to surround the IDT electrodes 3. By performing this, in the surface acoustic wave device 1 of FIG. 13, the circumferential edge region of the lid part 5b of the sealing member 5 is joined through the intermediate layer 7 to the insulation film 4 on the base 2. Note that, in the surface acoustic wave device 1 shown in FIG. 13, components the same or similar to those of the surface acoustic wave device shown in FIG. 2 are assigned the same notations and detailed explanations are omitted.

Figure 14:
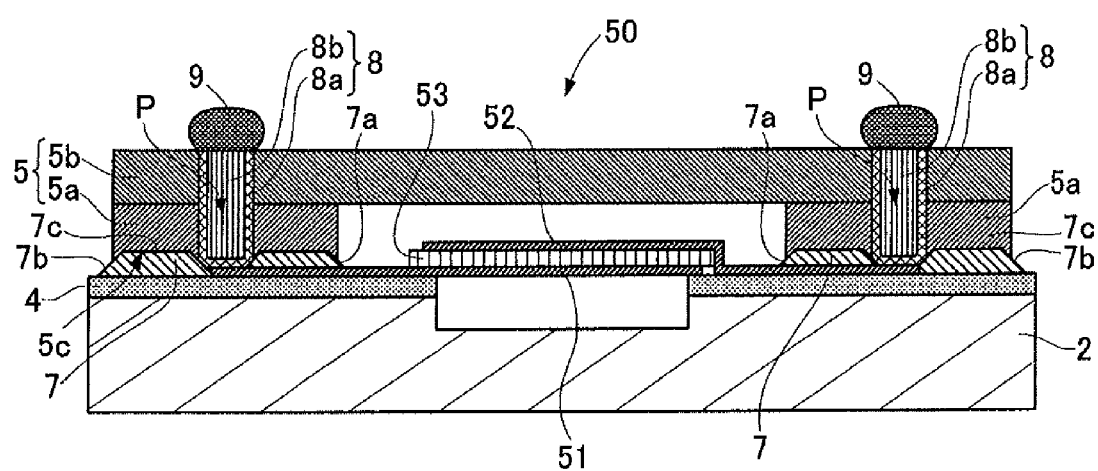
FIG. 14 A cross-sectional view of principal parts of a thin film bulk acoustic resonator according to an embodiment of the present invention.
Figure 15:
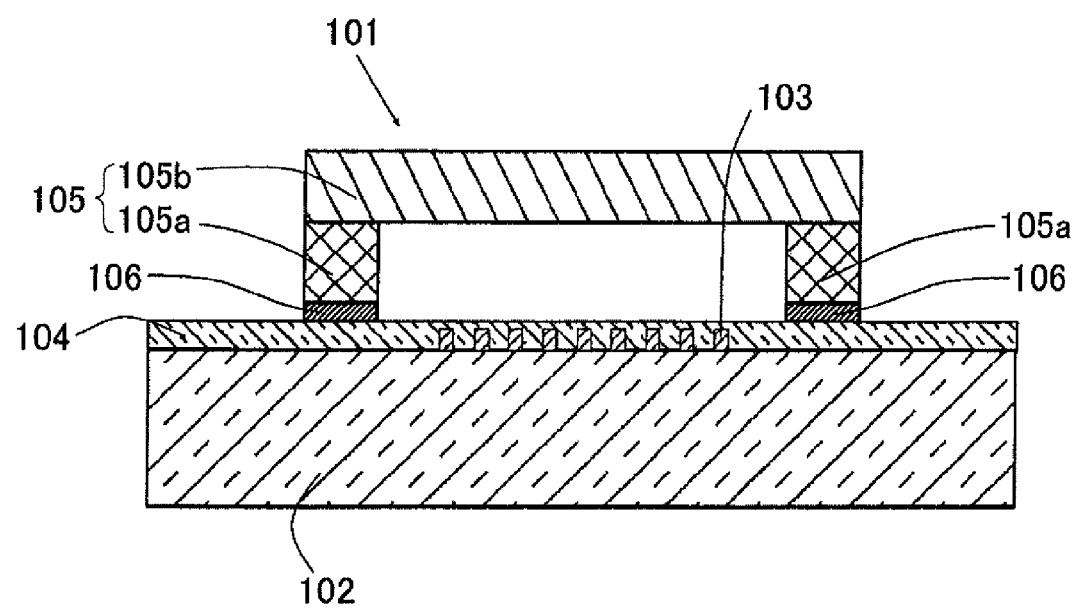
FIG. 15 A cross-sectional view of principal parts of a conventional surface acoustic wave device.

Further, in the above embodiment, a surface acoustic wave device is exemplified. However, the acoustic wave device according to the present invention can be applied to, for example, a thin film bulk acoustic resonator comprised of a thin piezoelectric film sandwiched between excitation electrodes. FIG. 14 is a cross-sectional view of principal parts of a thin film bulk acoustic resonator showing an example thereof. Note that, in the thin film bulk acoustic resonator shown in FIG. 14, components the same or similar to those of the surface acoustic wave device shown in FIG. 1 to FIG. 3 are assigned the same notations and detailed explanations are omitted.

The thin film bulk acoustic resonator 50 shown in FIG. 14 differs mainly in the constitution which becomes the vibrating body of the present invention compared with the surface acoustic wave device 1 shown in FIG. 2. In the thin film bulk acoustic resonator 50, the vibrating body in the present invention is constituted by a lower electrode 51 and an upper electrode 52 arranged in the space inside the sealing member 5 and by a thin piezoelectric film 53 interposed between the upper electrode 52 and the lower electrode 51. The lower electrode 51 and the upper electrode 52 are respectively connected to the electrode posts 8. Voltages which become excitation signals are impressed between the lower electrode 51 and the upper electrode 52. Accordingly, the thin piezoelectric film 53 causes a thickness vertical vibration. That vibration generates resonance in the thickness direction of the thin piezoelectric film 53. In this thin film bulk acoustic resonator 50 as well, the recess 5c formed in the frame-shaped part 5a of the sealing member 5 accommodates a portion of the intermediate layer 7, therefore the peel strength between the sealing member 5 and the intermediate layer 7 can be improved.

The invention claimed is:

1. An acoustic wave device, comprising:
    a base with a vibrating body;
    a sealing member which is joined to the base in a frame-shaped region surrounding the vibrating body and faces the vibrating body with a space therebetween;
    an intermediate layer between the frame-shaped region of the sealing member and the base; and
    an electrode post penetrating the intermediate layer,
    wherein the frame-shaped region has a recess and at least a portion of the intermediate layer is located inside the recess, and at a hole in the intermediate layer through which the electrode post penetrates, an inner circumferential surface of the hole has a portion contacting the electrode post, the portion being inclined so that the diameter of the hole becomes smaller from the sealing member side toward the base side.

2. The acoustic wave device according to claim 1, wherein the frame-shaped region of the sealing member is joined with at least a portion of side surfaces of the intermediate layer.

3. The acoustic wave device according to claim 2, wherein the side surfaces of the intermediate layer comprise side surfaces inclined so that the width of the intermediate layer is increased as approaching the base side from the sealing member side.

4. The acoustic wave device according to claim 2, wherein the side surfaces of the intermediate layer include an inner side surface inclined so that the inner side surface is closer to the vibrating body as the inner side surface approaches the base side from the sealing member side.

5. The acoustic wave device according to claim 2, wherein the side surfaces of the intermediate layer include outer side surface inclined being further away from the vibrating body as approaching the base side from the sealing member side.

6. The acoustic wave device according to claim 1, wherein the intermediate layer continuously surrounds the vibrating body.

7. The acoustic wave device according to claim 1, further comprising a protective film covering the vibrating body.

8. The acoustic wave device according to claim 7, wherein the protective film comprises an extended part extending an area between the frame-shaped region of the sealing member and the base, and the extending part constitutes the intermediate layer.

* * * * *